(12) United States Patent
Andre et al.

(10) Patent No.: US 8,610,610 B2
(45) Date of Patent: Dec. 17, 2013

(54) SYSTEM FOR CALIBRATING A TIME CONSTANT OF AN INTEGRATED CIRCUIT, AND INTEGRATED CIRCUIT PROVIDED WITH SUCH A SYSTEM

(75) Inventors: Eric Andre, Hurtieres (FR); Sébastien Lefebvre, Lumbin (FR); Jonathan Amiach, Biot (FR)

(73) Assignee: ST-Ericsson SA, Plan-les-Ouates (FR)

( * ) Notice: Subject to any disclaimer, the term of this patent is extended or adjusted under 35 U.S.C. 154(b) by 23 days.

(21) Appl. No.: 13/146,898

(22) PCT Filed: Jan. 28, 2010

(86) PCT No.: PCT/EP2010/050965
§ 371 (c)(1),
(2), (4) Date: Oct. 17, 2011

(87) PCT Pub. No.: WO2010/086347
PCT Pub. Date: Aug. 5, 2010

(65) Prior Publication Data
US 2012/0026024 A1   Feb. 2, 2012

(30) Foreign Application Priority Data

Jan. 28, 2009  (FR) ...................................... 09 50523

(51) Int. Cl.
*H03M 3/00* (2006.01)
(52) U.S. Cl.
USPC .......................................... 341/143; 341/120
(58) Field of Classification Search
USPC ........... 341/120, 118, 143; 327/553, 362, 552
See application file for complete search history.

(56) References Cited

U.S. PATENT DOCUMENTS

| | | | |
|---|---|---|---|
| 3,914,694 A * | 10/1975 | Shawhan | 332/135 |
| 3,940,715 A | 2/1976 | Lum | |
| 4,730,499 A | 3/1988 | Gianella et al. | |
| 5,392,456 A * | 2/1995 | Mitomo et al. | 455/340 |
| 6,107,870 A * | 8/2000 | Kawano | 327/553 |
| 6,169,446 B1 | 1/2001 | Ramet et al. | |
| 6,262,603 B1 | 7/2001 | Mohan et al. | |
| 6,803,813 B1 | 10/2004 | Pham | |
| 7,078,961 B2 | 7/2006 | Punzenberger et al. | |
| 2004/0183602 A1 | 9/2004 | Maunuksela et al. | |
| 2005/0237233 A1* | 10/2005 | Muhammad | 341/143 |
| 2006/0033560 A1* | 2/2006 | Kurose et al. | 327/552 |

FOREIGN PATENT DOCUMENTS

FR   2400279 A   3/1979

OTHER PUBLICATIONS

Patent Cooperation Treaty International Search Report and Written Opinion for PCT/EP2010/050965; Oct. 22, 2010; 8 pages.
Rapport De Recherche Preliminaire; Institut National de la Propriete Industrielle (French Search Report); Joseph Kreutz; Jun. 17, 2009, 2 pages.

* cited by examiner

*Primary Examiner* — Brian Young
(74) *Attorney, Agent, or Firm* — Howison & Arnott, L.L.P.

(57) ABSTRACT

System and method for calibrating a time constant R0Ci of an integrated electronic current-feedback continuous-time delta sigma analog/digital converter (modulator) having a variable-impedance filter coupled to input of the modulator, an analog input signal Vin of fixed frequency applied to the variable-impedance filter, wherein the analog input signal Vin attenuation engendered by the variable-impedance filter is measured, and the value of a time constant R0Ci in the modulator and value of the impedance of the variable-impedance filter are modified until an attenuation corresponding to the desired attenuation for the integrated electronic circuit modulator is obtained.

20 Claims, 4 Drawing Sheets

SYSTEM FOR CALIBRATING A TIME CONSTANT OF AN INTEGRATED CIRCUIT, AND INTEGRATED CIRCUIT PROVIDED WITH SUCH A SYSTEM

CROSS-REFERENCE TO RELATED APPLICATIONS

This application is a U.S. National Phase application submitted under 35 U.S.C. §371 of Patent Cooperation Treaty application serial no. PCT/EP2010/050965, filed Jan. 28, 2010, and entitled SYSTEM FOR CALIBRATING A TIME CONSTANT OF AN INTEGRATED CIRCUIT, AND INTEGRATED CIRCUIT PROVIDED WITH SUCH A SYSTEM, which application claims priority to French patent application serial no. 0950523, filed Jan. 28, 2009, and entitled SYSTEM FOR CALIBRATING TIME CONSTANT OF AN INTEGRATED CIRCUIT, AND INTEGRATED CIRCUIT PROVIDED WITH SUCH A SYSTEM.

Patent Cooperation Treaty application serial no. PCT/EP2010/050965, published as WO 2010/086347, and French patent application serial no. FR 0950523, are incorporated herein by reference.

TECHNICAL FIELD

The invention relates to microelectronics, and more particularly to the calibration of a time constant RC.

It also pertains to an integrated circuit, in particular an analog/digital converter, provided with such a system.

BACKGROUND

Certain signal processing functions used in analog integrated circuits are based on the value of a time constant RC. Typically, the coefficients of an analogue filter or else of an analog digital converter, such as a continuous-time delta-sigma analog digital converter, are achieved by means of resistance R and capacitances C.

The product RC of an analog filter corresponds to its cutoff frequency. For a continuous-time delta-sigma analog digital converter, this time constant RC is related to its sampling frequency. In both these cases, the precision of the time constant RC is important. For the cutoff frequency, if RC is estimated with too high a value, the filter cuts off a part of the signal, and if RC is too small, then the filter does not attenuate the signal sufficiently. In the case of the delta-sigma modulator, it is the performance and the stability of the modulator that depend directly on the precision of the value of RC. The RC coefficients achieve the transfer function of the current-feedback continuous-time delta-sigma analog digital converter.

Depending on the application, the precision with which the product RC must be known is higher or lower. A precision of the value of the time constant RC to +/−5% is generally sufficient.

However, an integrated resistance is accurate to +/−15% while the value of an integrated capacitance varies at least by +/−20% depending on the technology. In conclusion, the time constant RC has a precision of +/−35% which is not sufficient for the great majority of applications.

Various schemes for calibrating a time constant are already known in the prior art. Reference may be made in this regard to the documents U.S. Pat. Nos. 6,169,446, 6,262,603, 6,803,813 and 7,078,961.

The calibration described in these documents is based on a comparison of the value of the time constant defined by the product RC with a known and accurate time base formulated, for example, by a quartz-driven clock, or on a comparison of the voltage across the terminals of the resistance R with that present across the terminals of the capacitance C when they are traversed by the same current.

These schemes for calibrating the time constant RC merely deliver a digital word which directly controls a resistance or a variable capacitance.

Moreover, they are all sensitive to the analogue imperfections intrinsic to the hardware components used to make the converter, such as the offset voltage of an operational amplifier or of the comparators used.

Moreover it is known, in the prior art, to use a current-feedback continuous-time delta-sigma analog digital converter coupled to a filter at input receiving a sinusoidal input signal, so as to calibrate the time constant of another current-feedback continuous-time delta-sigma analog digital converter.

However, the use of a second current-feedback continuous-time delta-sigma analogue digital converter is expensive in terms of time and cost.

In view of the foregoing, it is proposed to circumvent most of these limitations related to the calibration of a time constant by carrying out a measurement of a time constant of an integrated circuit of increased precision.

SUMMARY

In one aspect, there is proposed, according to one mode of implementation, a method for calibrating a time constant of an integrated electronic circuit.

In this method, a variable-impedance filter is coupled at the input of the integrated electronic circuit, an analog input signal of fixed frequency is applied to the filter, the analog input signal attenuation engendered by the filter is measured, and the value of the time constant and the value of the impedance of the variable-impedance filter are modified until an attenuation corresponding to the desired attenuation for the integrated electronic circuit is obtained.

The time constant may be formed by a resistive element and by a capacitive element.

The analog input signal attenuation engendered by the filter is determined preferably by comparing a power measurement carried out without filter with a power measurement carried out with the filter.

The selection of measurement with and without filter can advantageously be carried out with the aid of a controlled filter make/break switch which couples the filter to the integrated. circuit.

Advantageously, the variable-impedance filter can comprise a first variable-impedance hardware component and a second variable-impedance hardware component, the first and second hardware components comprising a fixed hardware component with fixed impedance and an assembly of unit hardware components with unit impedance selectively coupled to the fixed hardware component under the control of make/break switches.

The fixed hardware component and the unit hardware components can advantageously each comprise a resistor.

The fixed hardware component and the unit hardware components can also each comprise a capacitor.

The value of the time constant may be modified by generating a digital control word for operating the make/break switches, the said word corresponding to the deviation between the measured attenuation and the desired attenuation for the integrated electronic circuit.

Each bit of the digital word generated controls a make/break switch coupling a unit assembly to a fixed hardware component of a variable-impedance hardware component. Thus, by controlling the closing or the opening of a make/break switch in accordance with the value of the bit, a unit hardware component will be coupled or decoupled to the fixed hardware component, thus modifying the impedance of the variable-impedance hardware component, and consequently the value of the time constant.

The number of bits of the digital word and the value of the unit hardware component of a variable-impedance hardware component are thus advantageously modified as a function of a precision in the time constant.

According to the precision required for the time constant, it is possible to modify the value of the impedance of the unit hardware components of a variable-impedance hardware component, and the number of unit assemblies. For example, by using a significant number of unit assemblies and a low impedance for the unit hardware component, the precision of the value of the impedance of the variable-impedance hardware component will be increased.

The analog input signal may be a square signal.

The calibration of a time constant RC is generally carried out by measuring the attenuation of an ideally sinusoidal signal of fixed and known frequency through the cut off band of an RC filter, however, the synthesis of a sinusoidal signal is complex. In order to simplify the embodiment of the system, the input signal used during the power measurements is a square signal gated at a sub-multiple of the sampling frequency of the analog/digital converter (ADC). The analogy with a sinusoidal signal is made by considering the measurements on its fundamental.

Advantageously, the integrated electronic circuit is a modulator of delta-sigma type.

In another aspect, there is proposed, according to one embodiment, a system for measuring a time constant of an integrated electronic circuit.

It comprises a variable-impedance filter coupled at the input of the integrated electronic circuit, analysis means able to measure attenuation of an analog input signal of fixed frequency engendered by the filter and to modify the value of the time constant and the value of the impedance of the variable-impedance filter until an attenuation corresponding to the desired attenuation for the integrated electronic circuit is obtained.

The integrated circuit may comprise a resistive element and a capacitive element forming the time constant.

The system advantageously comprises a filter make/break switch making it possible to couple the filter to the input of the integrated circuit, the said filter make/break switch being controlled by the integrated electronic circuit.

Advantageously, the variable-impedance filter comprises a first variable-impedance hardware component and a second variable-impedance hardware component, the first and second hardware components comprising a fixed hardware component with fixed impedance and an assembly of unit hardware components with unit impedance selectively coupled to the fixed hardware component under the control of make/break switches.

The fixed hardware component and the unit hardware components can advantageously each comprise a resistor.

The fixed hardware component and the unit hardware components can also each comprise a capacitor.

The analysis means may comprise means able to generate a digital word corresponding to the deviation between the measured attenuation and the desired attenuation for the integrated electronic circuit.

The integrated electronic circuit can advantageously comprise a modulator of delta-sigma type.

BRIEF DESCRIPTION OF THE DRAWINGS

Other advantages and characteristics of a method and system for calibration of increased precision will be apparent on examining the detailed description of wholly non-limiting embodiments, and the appended drawings, in which.

DETAILED DESCRIPTION

Modes of implementation of a method and of a system for calibrating a time constant of an integrated circuit will be described with reference to FIGS. 1 to 5.

In the modes described, the time constant is formed by a capacitor and a resistor. Furthermore, according to the aspects described, the integrated circuit consists of a modulator of delta-sigma type.

Figure 1:
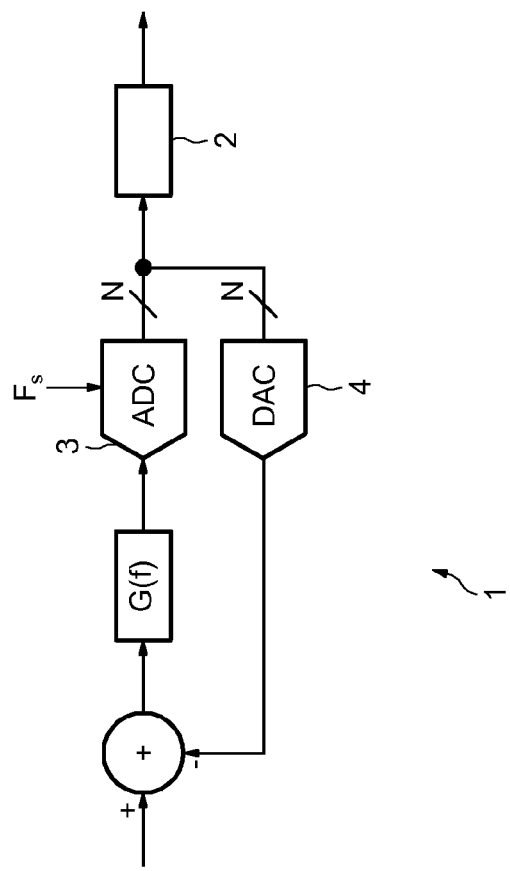
FIG. 1 represents a basic diagram of an analog/digital converter of delta-sigma type.

A basic diagram of a current-feedback continuous-time delta-sigma analog/digital converter, of order one, has been represented in FIG. 1. It comprises a modulator 1 of delta-sigma type followed by a decimation digital filter 2.

The modulator 1 here is an analog/digital converter with oversampling and shaping of the quantization noise. it comprises an analog/digital converter 3 (ADC) of low resolution, typically 1 bit, placed in a negative feedback loop which comprises a digital/analog converter 4 (DAC), and whose quantization noise is rejected towards the high frequencies by virtue of a function G(f) placed in the loop.

The decimation digital filter 2 makes it possible to suppress the off-band quantization noise, and to reduce the throughput of the digitized signal to the Nyquist frequency after sub-sampling, i.e. a processing frequency of the digital systems connected directly behind.

Ideally, a sinusoidal signal is used as an input signal of the filter placed upstream of the modulator 1. This sinusoidal signal can be implemented by a square signal, which is simpler to synthesize than a sinusoidal signal. The use of a square signal at the input requires that the decimation filter 2 eliminates the harmonics, which are detrimental to the precision of the attenuation measurement. This additional constraint may make it necessary to synthesize a decimation digital filter dedicated to auto-calibration. Typically, this involves a cardinal sine filter, which rejects harmonics, by strongly attenuating the frequencies corresponding to the frequencies of the harmonics.

The performance of such a delta-sigma modulator 1 depends on the over-sampling ratio, the number of bits N of the ADC/DAC pair and the order of the loop filter G(f).

Figure 2:
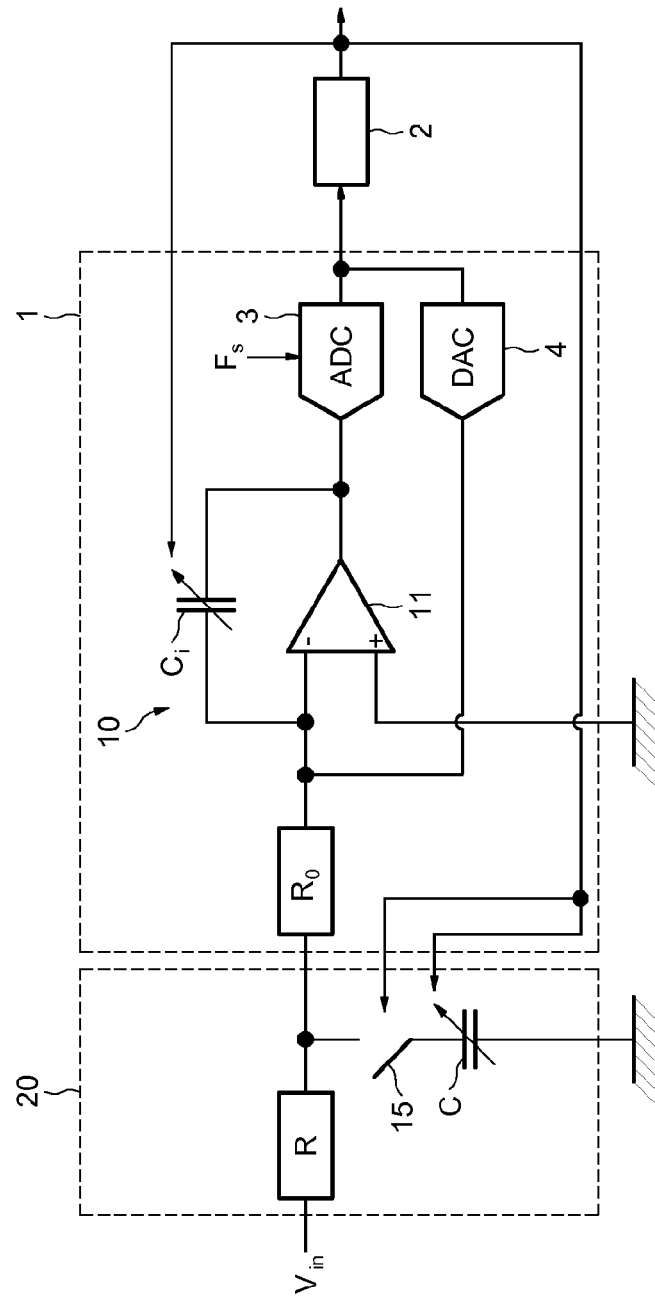
FIG. 2 presents an electronic diagram of a system for calibrating a time constant according to one embodiment.

Based on the principle described in FIG. 1, an embodiment of a system for calibrating a time constant RC formed by the association of a resistor R and of a capacitor C has been detailed in FIG. 2.

It comprises, as in the example of FIG. 1, a modulator 1 of delta-sigma type comprising an analog/digital converter 3 (ADC) and a digital/analog converter 4 (DAC), and a decimation filter 2.

The modulator 1 essentially comprises an integrator 10 that carries out the function G(f) in the negative feedback loop of FIG. 1. This integrator 10 comprises an operational amplifier 11 and an adjustable integration capacitance Ci connected between the inverting terminal and the output terminal of the amplifier 11. This inverting terminal is also coupled to a resistor R0. The non-inverting terminal of the amplifier 11 is connected to earth.

The output of the operational amplifier 11 of the integrator 10 is coupled to the converter ADC 3, which samples the output of the integrator 10 at a sampling frequency Fs. The converter ADC 3 is coupled at the output to a converter DAC 4, which is also coupled to the inverting terminal of the operational amplifier 11.

The converter DAC 4, in this embodiment, consists of a current generator.

The decimation filter 2 receives as input the output signal from the converter ADC 3, and controls the value of the adjustable integration capacitance Ci as a function of the attenuation measured on the basis of the comparison of the measurements of powers performed.

The modulator 1 is coupled at input to a its variable-impedance filter 20 formed by a resistor R and a capacitor C. The variable-impedance filter 20 can consist of a variable resistance or a variable capacitor. In this embodiment, the resistor R is fixed and the capacitor C is variable, so as to be in correspondence with the adjustable integration capacitance Ci.

It should be noted that the resistor R of the variable-impedance filter 20 may be variable, and the resistor R0 of the modulator 1 may also be variable, thereby making it possible for the integration capacitance Ci to be fixed.

A controlled filter make/break switch 15 makes it possible to couple, in this embodiment, the variable capacitor C to the filter 20 and thus optionally to form the filter 20. It is thus possible for the integrated circuit modulator 1 to control a power measurement with filter 20 or a power measurement without filter 20 by controlling the make/break switch 15.

The decimation filter 2 controls the value of the variable capacitor C in correspondence with the value of the integration capacitance Ci, and also controls the make/break switch 15 according to the desired type of power measurement.

At the input of the calibration system, i.e. to a terminal of the resistor R, is applied an analog input signal Vin of fixed frequency. The calibration of the time constant R0Ci is generally carried out by measuring the attenuation of an ideally sinusoidal signal of fixed frequency engendered by the variable impedance filter 20. In order to simplify the embodiment of the system, the analog input signal Vin used in this embodiment is a square signal gated at a sub-multiple of the sampling frequency Fs of the converter ADC 3. The analogy with a sinusoidal signal is then made by considering the measurements on its fundamental.

Figure 3:
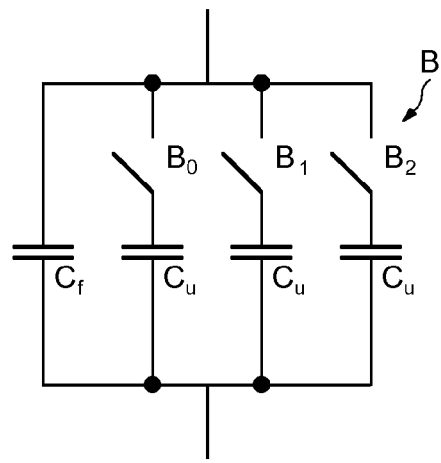
FIG. 3 presents an electronic architecture of an adjustable capacitor according to one embodiment.

FIG. 3 presents an electronic architecture of an adjustable capacitor 30 according to one embodiment, which can be used according to the embodiment of FIG. 2 for the adjustable integration capacitance Ci and the variable capacitor C of the variable-impedance filter 20.

The adjustable capacitor 30 comprises a fixed capacitance Cf, which fixes the minimum value of the adjustable capacitance, and of at least one unit capacitance Cu coupled in series with a make/break switch B. The fixed capacitance Cf is coupled in parallel with at least one unit assembly comprising a make/break switch B and a unit capacitance Cu. For example, for the embodiment of the adjustable capacitor C, the assembly is connected between earth and the common node between the resistor R and the resistor R0. The value of the adjustable capacitance can thus be adjusted by closing the make/break switches of the unit assemblies so as to couple as many unit capacitances Cu as necessary with the fixed capacitance Cf to obtain the desired capacitive value. Thus, according to one embodiment, by opening or closing the make/break switches B0, B1, B2, it is possible to modify the value of the variable capacitance, by coupling or decoupling unit capacitances Cu to the fixed capacitance Cf.

According to the value of the unit capacitances, and according to the number of unit assemblies available, the precision of the value of the adjustable capacitance, and consequently the precision of the time constant R0Ci, can be modified.

The make/break switches are controlled by digital bits arising from the decimation filter 2. Of course, the length of the word, that is to say the number of bits of the word, corresponds to the overall number of unit capacitances Cu. Thus, the greater the number of bits provided by the decimation filter 2, the greater the number of unit assemblies and the more the precision in the value of the time constant R0Ci is increased.

Figure 4:
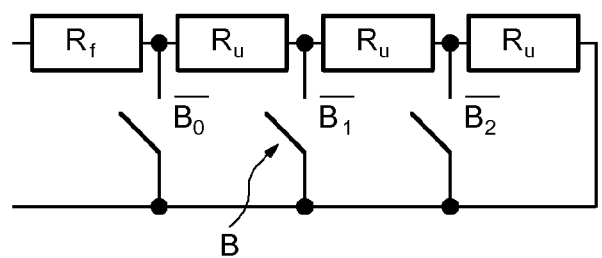
FIG. 4 presents an electronic architecture of an adjustable resistor according to one embodiment.

FIG. 4 presents an electronic architecture of an adjustable resistor 40 according to one embodiment, which can be used in embodiments of the invention, according to a different embodiment from FIG. 2, for the resistor R0 of the modulator 1 if the resistor 40 is embodied so as to be adjustable. The adjustable resistor 40 may also be used for the resistor R of the variable-impedance filter 20 if the resistor 40 is also embodied so as to be adjustable.

The adjustable resistor comprises a fixed resistor 40 Rf, which fixes the minimum value of the adjustable resistor, and of at least one unit resistor Ru coupled to a make/break switch B. The fixed resistor Rf is wired in series with at least one unit resistor whose current input terminal is coupled to a make/break switch connected so as to short-circuit the unit resistor to which it is directly coupled at the current input of the resistor as well as all the unit resistors coupled after this make/break switch.

For example, when this arrangement is intended to form the adjustable resistor R0, the fixed resistor Rf is connected to the current output terminal of the resistor R of the filter 20, while the free terminals of the make/break switches B of the resistor R0 are wired to the modulator 1.

The value of the adjustable resistor can thus be adjusted by opening the make/break switches on as to couple as many unit resistors Ru as necessary with the fixed resistor Rf to obtain the desired resistance. Thus, according to one embodiment, by opening or closing the make/break switches $\sqrt{B_0}$, $\sqrt{B_1}$, $\sqrt{B_2}$, it is possible to modify the resistance of the variable resistor 40.

Figure 5:
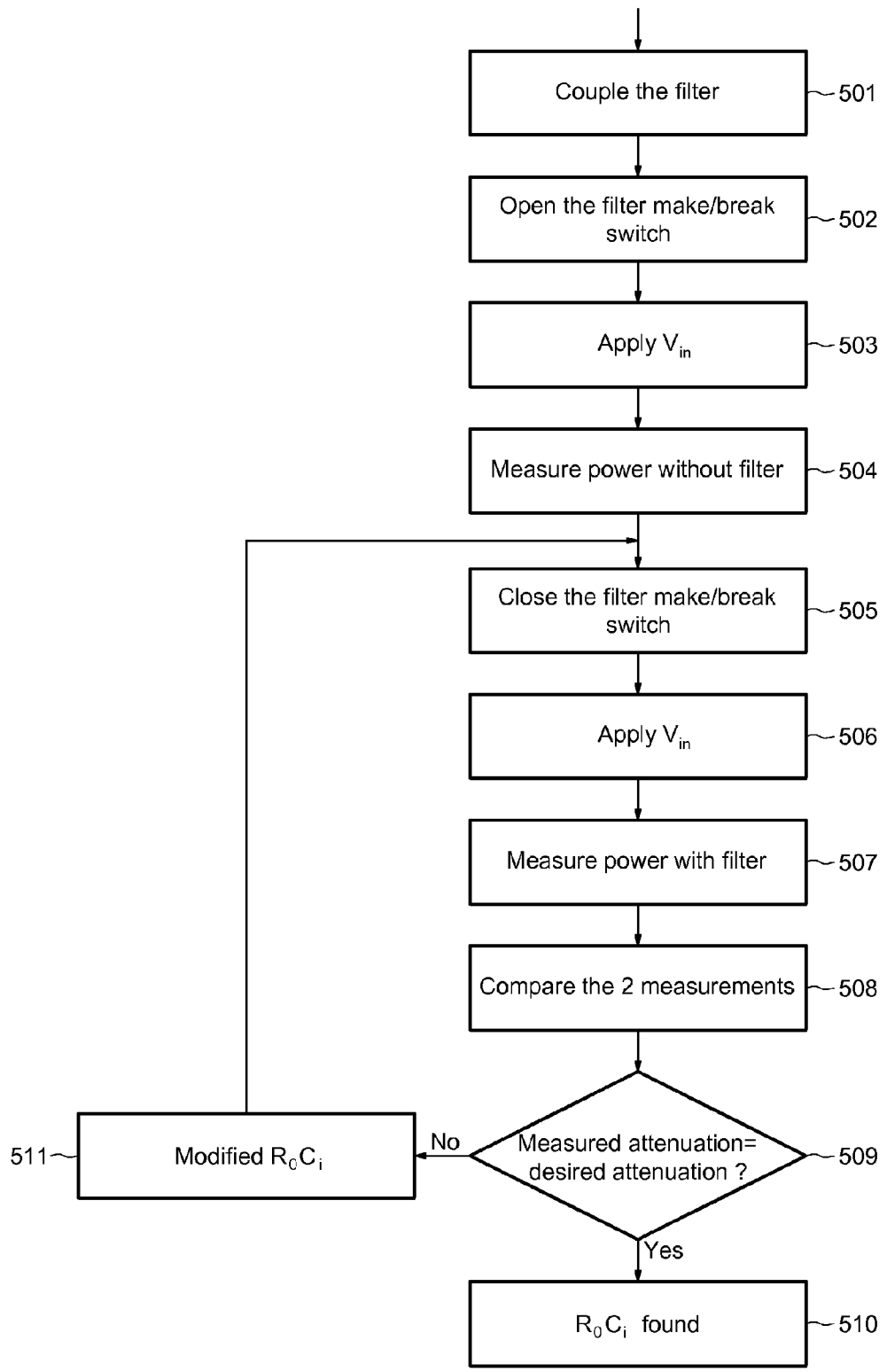
FIG. 5 illustrates a method for calibrating the time constant according to one mode of implementation.

FIG. 5 illustrates a method for calibrating the time constant RC of an integrated. electronic circuit according to one mode of implementation. According to this mode of implementation, the time constant is formed by the resistance R0 of the modulator 1 and the adjustable integration capacitance Ci.

In a first step 501, and also referring to FIG. 2, a variable-impedance fitter 20 comprising a resistor R and a variable capacitor C is coupled to the input of the modulator 1. In a following step 502, the filter make/break switch 15 is opened so as to decouple the variable capacitor C from the filter 20 with a view to carrying out a power measurement without filter 20 subsequently. In a third step 503, a known analog input signal Vin of fixed frequency is applied. The analog input signal Vin used in this embodiment is a square signal gated at a sub-multiple of the sampling frequency Fs of the converter ADC 3. In a following step 504, the power at the output of the modulator 1 is measured with the aid of the decimation fitter 2.

Secondly, the filter make/break switch 15 is closed (step 505) with a view to coupling the variable capacitor C of the filter 20 and thus carry out a power measurement with the filter 20. In a step 506, the same known analog input signal Vin of fixed frequency, namely a square signal gated at a sub-multiple of the sampling frequency Fs of the converter ADC 3, is then applied. In a step 507, the power at the output of the modulator I is thereafter measured with the aid of the decimation filter 2.

Thirdly, in a step 508, the power measurement carried out without filter 20 is compared with the power measurement carried out with the fitter 20, making it possible to obtain a direct image of the analogue input signal yin attenuation engendered by the filter 20. In a step 509, a test is performed to ascertain whether the measured attenuation corresponds to the desired attenuation.

When the measured attenuation corresponds to the desired attenuation, it is considered that the time constant R0Ci corresponds to the last value applied to the adjustable integration capacitance Ci (step 510).

When the attenuation is too high, the R0Ci pair is too high and the corresponding cutoff frequency fc is too low. The decimation filter 2 then chooses a lower R0Ci pair in a step 511, before recommencing in step 505 for a new power measurement with the filter 20.

As a reminder, the cutoff frequency is expressed according to the following expression:

$$f_c = \frac{1}{2\pi R_0 C_i}$$

When on the other hand the attenuation is too low, the R0Ci pair is too low and the cutoff frequency fc is too high. The decimation filter 2 then chooses a higher R0Ci pair in a step 511 before recommencing at step 505 for a new power measurement with the fitter 20.

It should be noted that the power measurement of a continuous signal is simpler than that of a periodic signal of frequency fi. It is therefore judicious to transpose the fundamental of the square signal to the zero frequency, such as that of a continuous signal, where the power measurement corresponds to the continuous value of the transposed signal. The transposition is carried out by multiplying, in the time domain, the image of the fundamental of frequency fi by a sinusoid of the same frequency fi. The resultant is the sum of a continuous component and of a component at twice the frequency 2fi weighted by a factor of a half.

In continuous mode, the power measurement then corresponds to a measurement of the mean value of the signal. Such an operation is achievable with a digital integration carried out for a number N of periods and whose final value is divided by this number N. Over this number N of periods, the z-transfer function of the mean is as follows:

$$mean_N(z) = \frac{1}{N} \cdot \frac{z^{-1}}{1-z^{-1}}$$

The division by the number N of periods can be simplified in the case where the number N is a power of two, thereby corresponding to successive shifts.

There is therefore proposed, according to the present description, the use of an integrated electronic circuit, in particular a current-feedback continuous-time delta-sigma converter, making it possible to provide an autocalibration of the time constant R0Ci of this same current-feedback continuous-time delta-sigma converter, on the basis of a measurement of the attenuation of a square analog input signal of fixed frequency through the cut off band of a filter coupled at the input of the delta-sigma converter. By comparing a power measurement without filter 20 with a power measurement with the filter 20, the measured attenuation is determined and is compared with the desired attenuation. The value of the time constant R0Ci and the value of the filter 20 are then modified in correspondence until the desired attenuation is obtained.

The invention claimed is:

1. A method for calibrating an adjustable time constant of an integrated modulator circuit, the method comprising:
   coupling a variable-impedance filter to an input of the integrated modulator circuit;
   applying an analog input signal of fixed frequency to an input of the variable-impedance filter;
   measuring, using a decimation filter, an attenuation of the analog input signal engendered by the variable-impedance filter; and
   modifying the value of the adjustable time constant or the value of the impedance of the variable-impedance filter until an attenuation corresponding to a desired attenuation for the integrated modulator circuit is obtained.

2. The method according to claim 1, in which the adjustable time constant is formed by a resistive element (R0) and by a capacitive element (Ci) within the integrated modulator circuit.

3. The method according to claim 1, wherein the measuring of the attenuation of the analog input signal engendered by the variable-impedance filter further comprises comparing a first power measurement carried out with the variable-impedance filter set at a minimum impedance with a second power measurement carried out with the variable-impedance filter set at first selected impedance.

4. The method according to claim 3, wherein comparing further comprises decoupling and coupling a portion of the variable-impedance filter with a controlled filter make/break switch which decouples a portion of the variable-impedance filter to set the minimum impedance and couples a selected portion of the variable-impedance filter to set the first selected impedance.

5. The method in accordance with claim 1, wherein the variable-impedance filter comprises a first variable-impedance hardware component and a second variable-impedance hardware component, the first and second variable-impedance hardware components each comprising a fixed hardware component with fixed impedance and an assembly of unit hardware components, the first and second variable-impedance hardware components each further comprising unit impedance selectively coupled to the fixed hardware component under the control of a make/break switch for each one of the unit hardware components.

6. The method according to claim 5, in which the fixed hardware component and the unit hardware components each comprise a resistor.

7. The method according to claim 5, in which the fixed hardware component and the unit hardware components each comprise a capacitor.

8. The method according to claim 5, wherein modifying the value of the adjustable time constant further comprising generating a digital control word adapted to operate the first variable impedance hardware component make/break switches such that the value of the adjustable time constant is modified, the digital control word corresponds to a deviation between the measured attenuation and the desired attenuation for the integrated modulator circuit.

9. The method according to claim 8, wherein the number of bits of the digital control word and the value of the unit hardware component of first variable-impedance hardware component are modified as a function of a precision of the adjustable time constant.

10. The method according to claim 1, wherein the analog input signal is a square wave signal.

11. The method according to claim 1, wherein the integrated modulator circuit is a delta-sigma modulator.

12. A system for calibrating a time constant (R0Ci) value of an integrated modulator, the system comprising:
   a variable-impedance filter coupled to the input of the integrated modulator;
   an analysis circuit, comprising a decimation filter, adapted to measure the attenuation of an analog input signal of fixed frequency engendered by the variable-impedance filter and adapted to modify the time constant (R0Ci) value and an impedance value of the variable-impedance filter until an attenuation corresponding to the desired attenuation for the integrated modulator is obtained.

13. The system according to claim 12, wherein the integrated modulator comprises an R0 resistive element and a Ci capacitive element forming the time constant (R0Ci) value.

14. The system according to claim 12, further comprising a filter make/break switch adapted to couple and uncouple a portion of the variable-impedance filter with the input of the integrated modulator, the filter make/break switch being controlled by the integrated modulator.

15. The system according to claims 12, wherein the variable-impedance filter further comprises a first variable-impedance hardware component and a second variable-impedance hardware component, the first variable-impedance hardware component comprises a first fixed hardware component having a fixed impedance and a first assembly of unit hardware components each with a first unit impedance selectively coupled to the first fixed hardware component under control of a first plurality of make/break switches and the second variable-impedance hardware component comprising a second fixed hardware component with a second fixed impedance and a second assembly of unit hardware components each with a second unit impedance selectively coupled to the second fixed hardware component under the control of a second plurality of make/break switches.

16. The system according to claim 15, wherein the first or second fixed hardware component and the first or second assembly of unit hardware components each comprise a resistor.

17. The system according to claim 15, wherein the first or second fixed hardware component and the first or second assembly of unit hardware components each comprise a capacitor.

18. The system according to claim 12, wherein the analysis circuit is adapted to generate a digital control word that controls the first and second plurality of make/break switches, the digital control word corresponds to a deviation between the measured attenuation of and the desired attenuation for the integrated modulator.

19. The system according to claims 12, wherein the integrated modulator is a delta-sigma modulator.

20. A system for calibrating a time constant (R0Ci) value of an integrated modulator, the system comprising:
   a variable-impedance filter coupled to the input of the integrated modulator, wherein the integrated modulator comprises a delta-sigma modulator;
   an analysis circuit adapted to measure the attenuation of an analog input signal of fixed frequency engendered by the variable-impedance filter and adapted to modify the time constant (R0Ci) value and an impedance value of the variable-impedance filter until an attenuation corresponding to the desired attenuation for the integrated modulator is obtained.

\* \* \* \* \*